(12) United States Patent
Feldman et al.

(10) Patent No.: US 7,353,170 B2
(45) Date of Patent: Apr. 1, 2008

(54) NOISE-ADAPTIVE DECODING

(75) Inventors: Jon Feldman, Cambridge, MA (US); Ibrahim Abou-Faycal, Cambridge, MA (US); Matteo Frigo, Cambridge, MA (US)

(73) Assignee: Vanu, Inc., Cambridge, MA (US)

( * ) Notice: Subject to any disclaimer, the term of this patent is extended or adjusted under 35 U.S.C. 154(b) by 886 days.

(21) Appl. No.: 10/639,879

(22) Filed: Aug. 13, 2003

(65) Prior Publication Data
US 2004/0136452 A1 Jul. 15, 2004

Related U.S. Application Data

(60) Provisional application No. 60/403,180, filed on Aug. 13, 2002.

(51) Int. Cl.
*G10L 19/04* (2006.01)

(52) U.S. Cl. .................... 704/226; 714/760

(58) Field of Classification Search ............ 704/226; 714/760
See application file for complete search history.

(56) References Cited

U.S. PATENT DOCUMENTS

| | | | |
|---|---|---|---|
| 4,322,848 A * | 3/1982 | Snyder, Jr. ............... 714/760 |
| 5,539,858 A * | 7/1996 | Sasaki et al. ............ 704/212 |
| 5,805,633 A | 9/1998 | Uddenfeldt |
| 5,901,182 A | 5/1999 | Kot |
| 5,931,964 A | 8/1999 | Beming et al. |
| 5,973,643 A | 10/1999 | Hawkes et al. |
| 6,016,322 A | 1/2000 | Goldman |
| 6,035,207 A | 3/2000 | Wang et al. |
| 6,154,507 A | 11/2000 | Bottomley |
| 6,285,876 B1 | 9/2001 | Zhong |
| 6,356,911 B1 | 3/2002 | Shibuya |
| 6,381,726 B1 | 4/2002 | Weng |
| 6,442,392 B2 | 8/2002 | Ruutu et al. |
| 6,490,327 B1 | 12/2002 | Shah |
| 6,546,256 B1 | 4/2003 | Maloney et al. |
| 6,560,462 B1 | 5/2003 | Ravi et al. |
| 6,621,807 B1 | 9/2003 | Jung et al. |
| 6,631,142 B2 | 10/2003 | Miyamoto et al. |
| 6,757,544 B2 | 6/2004 | Rangarajan et al. |
| 6,788,750 B1 | 9/2004 | Reuven et al. |
| 6,915,123 B1 | 7/2005 | Daudelin et al. |
| 6,920,125 B1 | 7/2005 | Wu |
| 6,978,124 B2 | 12/2005 | Benes et al. |
| 6,987,798 B2 | 1/2006 | Ahn et al. |

(Continued)

OTHER PUBLICATIONS

International Search Report, PCT/US03/36709, mailed on May 25, 2004, 4 pgs.

(Continued)

*Primary Examiner*—Susan McFadden
(74) *Attorney, Agent, or Firm*—Fish & Richardson P.C.

(57) ABSTRACT

In one aspect the invention is a method for decoding. The method includes receiving encoded data and decoding the encoded data using a noise-adaptive decoder. The data may include first-order Reed-Mueller (FORM) based codes. The data may be based on Complementary Code Keying. Using a noise-adaptive decoder may include determining values of a hard decision based on a first decoding process and discarding the values of the hard decision if a noise sensitivity parameter is above a threshold value. The method may further include using a second decoder process if the noise sensitivity parameter is above the threshold value.

37 Claims, 2 Drawing Sheets

U.S. PATENT DOCUMENTS

| | | | |
|---|---|---|---|
| 7,010,559 B2* | 3/2006 | Rawlins et al. ............. | 708/425 |
| 7,013,150 B2 | 3/2006 | Okanoue et al. | |
| 7,068,638 B2 | 6/2006 | Choi et al. | |
| 7,116,986 B2* | 10/2006 | Jenkins et al. ........... | 455/456.1 |
| 2003/0012265 A1 | 1/2003 | Lin | |
| 2003/0063595 A1 | 4/2003 | You et al. | |
| 2004/0062214 A1 | 4/2004 | Schnack et al. | |
| 2004/0114623 A1 | 6/2004 | Smith | |
| 2004/0209580 A1 | 10/2004 | Steinheider et al. | |
| 2004/0252665 A1 | 12/2004 | Clark et al. | |
| 2004/0259571 A1 | 12/2004 | Joshi | |
| 2005/0163075 A1 | 7/2005 | Malladi et al. | |
| 2005/0228854 A1 | 10/2005 | Steinheider et al. | |
| 2005/0286536 A1 | 12/2005 | Steinheider et al. | |
| 2006/0007919 A1 | 1/2006 | Bose et al. | |

OTHER PUBLICATIONS

Cormen et al., 2001, Introduction to Algorithms Second Edition, McGraw-Hill, Boston.

Ekroot, L. and Dolinar, S., "A Decoding of Block Codes", *IEEE Transactions on Communications*, vol. 44 (9):1052-1056 (1996).

Fano, "A Heuristic Discussion of Probabilistic Decoding", *IEEE Transactions on Information Theory*, vol. IT9(1):64-74 (1963).

Forney, Jr., "Convolutional Codes II. Maximum-Likelihood Decoding", *Information and Control*, vol. 25:222-226 (1974).

Forney, Jr., "The Viterbi Algorithm", *Proceedings of the IEEE*, vol. 61(3):268-278 (1973).

Han et al., "Efficient Priority-First Search Maximum-Likelihood Soft-Decision Decoding of Linear Block Codes", *IEEE Transactions on Information Theory*, vol. 39(5):1514-1523 (1993).

Han et al., "A Maximum-Likelihood Soft-Decision Sequential Decoding Algorithm for Binary Convolutional Codes", *IEEE Transactions on Communications*, vol. 50(2):173-178 (2002).

Heller, J. and Jacobs, I. M., "Viterbi Decoding for Satellite and Space Communication", *IEEE Transactions on Communication Technology*, vol. Com-19(5):835-848 (1971).

Kang, G. and Zhang, P., "The Implementation of Viterbi Decoder on TMS320C6201 DSP in WCDMA System", *Beijing University of Posts and Telecommunications*.

Rajagopal, S., "A Real-Time Baseband Communications Processor for High Data Rate Wireless Systems", Dept. of Electrical and Computer Engineering, Rice University (2002).

Sereni et al., "A Software Re-Configurable Architecture for 3G and Wireless Systems", University of Perugia, Italy (2000).

Varga, R. and Harrison, M. (eds), The Art of Computer Programming-Second Edition, Addison-Wesley, Massachusetts (1973).

Viterbi, "Error Bounds for Convolutional Codes and an Asymptotically Optimum Decoding Algorithm", *IEEE Transactions on Information Theory*, vol. IT-13(2):260-269 (1967).

Wicker, S. B., Error Control Systems for Digital Communication and Storage, Prentice Hall, Englewood Cliffs, NJ (1995).

International Search Report—PCT/US03/25218.

http://www.fcc.gov/911/enhanced/.

http://www.arraycomm.com/.

EIA/TIA/IS-95 Mobile Station-Base Station Compatibility Standard for Dual-Mode Wideband Spread Spectrum Cellular System, Telecommunications Industry Association, Jul. 1993, pp. 6-1 to 6-8.

L. Trevisan, "Some Applications of Coding Theory in Computational Complexity," Quaderni di Matematica, vol. 13, pp. 347-424, 2004.

J.S. Lee and L.E. Miller, CDMA Systems Engineering Handbook, Artech House, Boston, 1998.

A.J. Viterbi, CDMA: Principles of Spread Spectrum Communication, Addison-Wesley, Reading, MA, 1995.

A.V. Oppenheim and R. W. Schafer, with J.R. Buck, Discrete-Time Signal Processing, 2nd ed., Prentice Hall, Upper Saddle River, NJ, 1999.

V.S. Pless and W.C. Huffman, Eds., Handbook of Coding Theory, vol. 1, Elsevier Science, Amsterdam, 1998.

S.J. MacMullan and O.M. Collins, "A Comparison of Known Codes, Random Codes, and the Best Codes," IEEE Transactions on Information Theory, vol. 44, No. 7, pp. 3009-3022, Nov. 1998.

M. Luby, "LT-codes," in Proceedings of the 43rd Annual IEEE Symposium on the Foundations of Computer Science (FOCS), pp. 271-280, 2002.

A. Shokrollahi, "Raptor codes," in Proceedings of the IEEE International Symposium on Information Theory, p. 36, 2004.

International Search Report, PCT/US05/07136, mailed on Dec. 26, 2006, 6 pgs.

M. Abramowitz, et al, *Handbook of Mathematical Functions with Formulas, Graphs and Mathematical Tables*, Dover Publications, New York, 1965.

J.L. Massey, *Threshold Decoding*, Technical Report 410, MIT Press, Cambridge, MA, 1963.

K. Paterson, et al., *Efficient Decoding Algorithms for Generalised Reed-Muller Codes*, Technical Report, Hewlett-Packard Labs, Nov. 1998.

Bob Pearson, *Complementary Code Keying Made Simple*, Application Note 9850, http://www/intersil.com/data/an/an9/an9850/an9850.pdf, May 2000.

I. Reed, *A Class of Multiple-Error-Correcting Codes and the Decoding Scheme*, IRETransactions on Information Theory, PGIT-4:38-49, Sep. 1954.

R. van Nee, *OFDM Codes for Peak-to-Average Power Reduction and Error Correction*, In Proc. IEEE Globecom '96, London, England, pp. 740-744, Nov. 1996.

G.N. Watson, *A Treatise on the Theory of Bessel Functions*, Second Edition, Cambridge University Press, 1952.

S. Wicker, *Error Control Systems for Digital Communciation and Storage*, Prentice-Hall, Englewood Cliffs, NJ, 1995.

R.K. Yarlagadda, et al., *Hadamard Matrix Analysis and Synthesis*, Luwer Academic Publishers, Dordrecht, 1997.

International Search Report PCT/US03/25219 mailed Dec. 16, 2003.

* cited by examiner

NOISE-ADAPTIVE DECODING

PRIORITY TO OTHER APPLICATIONS

This application claims priority from and incorporates herein U.S. Provisional Application No. 60/403,180, filed Aug. 13, 2002, and titled "A NOISE-ADAPTIVE ALGORITHM FOR FIRST-ORDER REED-MULLER DECODING".

BACKGROUND OF THE INVENTION

First-Order Reed-Muller (FORM) codes are widely used in communications applications ranging from the 1969 Mariner deep-space probe to the IEEE 802.11b standard for Wireless Local Area Networks (WLANs).

The IEEE 802.11 standard for wireless local area networks has high data rates in order to operate at speeds comparable to the Ethernet. Complementary Code Keying (CCK) was adopted by the IEEE as the modulation scheme to achieve this data.

BRIEF SUMMARY OF THE INVENTION

In one aspect the invention is a method for decoding. The method includes receiving encoded data and decoding the encoded data using a noise-adaptive decoder.

In another aspect of the invention, an apparatus for decoding, includes a memory that stores executable instruction signals and a processor. The processor executes instruction signals to receive encoded data and to decode the encoded data using a noise-adaptive decoder.

In a still further aspect, an article includes a machine-readable medium that stores executable instruction signals for decoding. The instruction signals cause a machine to receive encoded data and to decode the encoded data using a noise-adaptive decoder.

One or more of the aspects above may have one or more of the following features. The data may include first-order Reed-Mueller (FORM) codes. The data may be based on Complementary Code Keying (CCK). Using the noise-adaptive decoder may include determining values of a hard decision based on a first decoding process; discarding the values of the hard decision if a noise sensitivity parameter is above a threshold value; and using a second decoder process if the global sensitivity parameter is above the threshold value.

The first decoder process may be based on majority-logic. The second decoder process may be based on a Fast Hadamard Transform (FHT). The noise sensitivity parameter may be based on differences in phase. The noise-adaptive decoder uses at least two decoder processes. One of the at least two decoder processes may be chosen depending on a noise sensitivity parameter. The noise sensitivity parameter may be based on detected phase differences.

In another aspect, a receiver includes a noise-adaptive decoder. The receiver may be in a software radio environment. The receiver may be in a wireless local area network. The receiver may include a transceiver and the transceiver includes the receiver. The receiver may include an integrated circuit and the integrated circuit includes the noise-adaptive decoder.

The first decoder process may be based on a majority-logic. The second decoder process may be based on a Fast Hadamard Transform (FHT). The threshold value may be based on differences in phase.

The noise-adaptive decoder implicitly adapts to the noise conditions, runs significantly faster than known maximum-likelihood decoders, and yields an error rate that is very close to optimal. When applied to CCK demodulation, the decoder runs up to 4 times faster than a decoder based on the Fast Hadamard Transform (FHT), with a loss of at most 0.2 dB in error rate. The error rate of the noise-adaptive decoder is no worse than $2^{-\Omega(n)}$, where n is the length of a codeword.

The noise-adaptive decoder described herein can be implemented in a number of embodiments, including a software radio, local area networks a high-definition television, a global system for mobile (GSM) communications. Further, the noise-adaptive decoder can be implemented in integrated circuits (ICs) (such as application specific ICs (ASICs)) within receivers, transceivers, or the like.

Other features, objects and advantages will become apparent from the following detailed description when read in connection with the accompanying drawing in which:

DETAILED DESCRIPTION OF THE INVENTION

Figure 1:
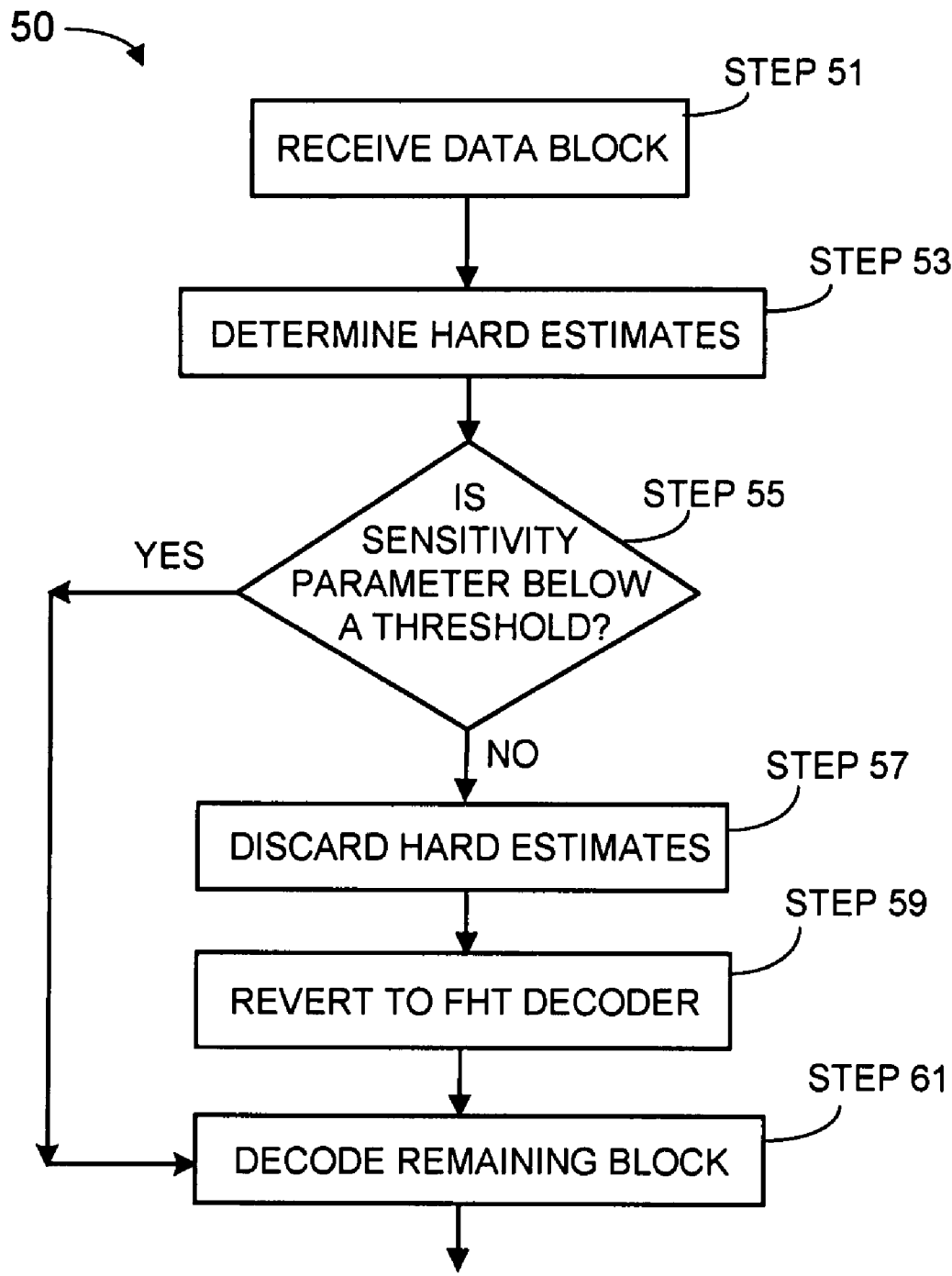
FIG. 1 is a flowchart for an exemplary process for noise-adaptive decoding.

While their good distance properties and simple structure make them attractive, soft-decision Maximum-Likelihood (ML) decoding of FORM codes requires computing the correlation between the received vector and all possible codewords. These operations are computationally expensive, especially at high data rates as is the case for Complementary Code Keying (CCK) demodulation in 802.11b. The most efficient known decoders for computing these correlations is based on the Fast Hadamard Transform (FHT). In this disclosure, a decoder that uses the FHT to perform a correlation of all possible codewords is referred to as an FHT decoder.

Even the FHT decoder may not be fast enough in certain systems such as software radios. In the particular case of CCK, the FHT decoder uses $O(n^2)$ operations to decode one codeword of block length n. Even for the simplest FORM code, the Hadamard code, the FHT decoder performs a superlinear $\Theta$ (n log n) number of operations.

Alternatively, one could use majority-logic or "threshold" decoding processes. Intuitively speaking, majority-logic decoders tally "votes" for the value of each information symbol based on simple calculations on the received codeword, and output the value with the most votes. Decoders of this kind are simple and fast, but they are suboptimal when used for soft-decoding FORM codes. When applied to CCK demodulation, the symbol error rate of majority-logic decoding can be up to 2.4 dB worse than optimal.

Nonetheless, the performance degradation of the majority-logic decoder is negligible when the noise is low. Ideally, one would like to use the fast majority-logic decoder when the noise is low, and the slower maximum-likelihood decoder when the noise is high. Unfortunately, the error conditions are not known in advance, and they tend to change over time anyway. Consequently, a decoding strategy is implemented that implicitly adapts its processing to the noise conditions without explicitly knowing what they are.

In this disclosure, an adaptive strategy is built for decoding FORM codes, which is referred to as a noise-adaptive decoder.

The noise-adaptive decoder uses a "soft average" as not only the value on which to make a hard decision, but also as a confidence measure in the decision. When this confidence measure dips below a certain level, a slower maximum-likelihood decoder is used.

The decoding speed of the noise-adaptive decoder is significantly improved over an optimized implementation of an FHT decoder, at the expense of a negligible degradation in error-correcting performance. When applied to CCK demodulation, the noise-adaptive decoder runs up to 4 times faster than FHT decoder, with a loss of at most 0.2 dB in error rate.

An analytical expression of the additive symbol error rate of the noise-adaptive decoder is obtained, assuming q-PSK modulation through an additive-white Gaussian Noise (AWGN) channel. The symbol error rate of the noise-adaptive decoder is at most an additive $2^{-\Omega(n)}$ worse than that of an optimal ML decoder, where n is the length of a codeword, as long as the noise is above a certain threshold. (The notation $\Omega(n)$ denotes some function that grows at least linearly with n.) The threshold is quite reasonable; for example, if using 4-PSK, then as long as the SNR is at least 4 dB, gives an upper bound of $2^{-n/10+1}$ on the additive difference in error rate between the noise-adaptive decoder and an ML decoder.

For the purposes of demodulation, CCK is essentially isomorphic to a simple FORM code. For the modulation step of CCK, an information sequence $(c_0, c_1, c_2, c_3)$ is a block of four symbols, where $c_i \in \{0, 1, 2, 3\}$. These are modulated using QPSK to values $\phi_i = \omega^{c_i}$, where $\omega = e^{\pi j/2}$ and $j = \sqrt{-1}$, and encoded into eight complex numbers $(y_0, \ldots, y_7)$ using the following encoding function:

| | | (1) |
|---|---|---|
| $y_0 = \Phi_0$ | $y_1 = -\Phi_0\Phi_1$ | |
| $y_2 = \Phi_0\Phi_2$ | $y_3 = \Phi_0\Phi_1\Phi_2$ | |
| $y_4 = -\Phi_0\Phi_3$ | $y_5 = \Phi_0\Phi_1\Phi_3$ | |
| $y_6 = \Phi_0\Phi_2\Phi_3$ | $y_7 = \Phi_0\Phi_1\Phi_2\Phi_3$ | |

These eight symbols are then subject to the AWGN channel.

$(r_0, \ldots, r_7)$ is used to denote the noisy symbols received at the other end of the channel has $r_i = y_i + N_i$, where $N_i$ is a complex Gaussian random variable with mean 0 and variance $2\sigma^2$. Based on the received vector r, the decoder must output hard estimates $\hat{c}_i$ of the information symbols $c_i$, where $i \in \{1, 2, 3\}$.

Two details in CCK make it slightly different than a FORM code. The negative signs in front of $y_1$ and $y_4$ are there to achieve better autocorrelation properties from the codewords, an important feature of CCK modulation. Additionally, the information carried by $\phi_0$ is differentially encoded; i.e., the actual information is the difference between the $\phi_0$ symbol of two successive blocks. Neither of these two issues affects the underlying decoding problem directly.

Consider the case where there is no noise in the channel, i.e., $N_i = 0$, and so $r_i = y_i$, for all i. Now, the decoding problem is simplified. For example, consider the expression $-r_1 r^*_0$. If there is no noise in the channel, then $-r_1 r^*_0 = -y_1 y^*_0 = \phi_1$. Similarly, $-r^*_4 r_6 = -y_4 y_6 = \phi_2$, and $r_7 r^*_3 = y_7 y^*_3 = \phi_3$. Therefore, when there is no noise in channel, $\phi_1$, $\phi_2$ and $\phi_3$ are "read off" using simple operations between certain received symbols.

In reality, these computations will be corrupted by noise, and will not always yield the correct answer. For example, $r_1 r^*_0 = (y_1 + N_1)(y_0 + N_0)^*$. However, $r_1 r^*_0 = -\phi_1$, and if the noise is low, then $r_1 r^*_0$ will be close to $\phi_1$.

The principle behind majority-logic decoding is to use simple computations on the received bits to produce "votes" for the value of each information symbol. In hard decision majority-logic, the value that receives the most votes becomes the decoded information symbol. In soft decision majority-logic, the votes are "soft" values, and they are averaged to form a "soft estimate" for each information symbol. Ideally, these votes should involve as many code bits as possible so that local noise cannot drastically affect the estimate.

In CCK, $(\phi_1', \phi_2', \phi_3')$ are used to denote the soft estimates for $\phi_1, \phi_2, \phi_3$, ($\phi_0$ is covered as a special case below), and compute each of them based on four votes as follows:

$\phi_1' = (-r_1 r^*_0 + r_3 r^*_2 - r^*_4 r_5 + r_7 r^*_6)/4$ $\phi_2' = (r_2 r^*_0 - r^*_1 r_3 - r^*_4 r_6 + r_7 r^*_5)/4$ $\phi_3' = (-r_4 r^*_0 - r^*_1 r_5 + r_6 r^*_2 + r_7 r^*_3)/4$ Ideally, if $\phi_1'$ is a good estimate of $\phi_1$, then $|\phi_1 - \phi_1'|$ should be small. The majority of logic decoders commit to a hard decision $c_i'$ for each information symbol $c_i$, based on $\phi_1'$. By a hard decision based on $\phi_1'$, it is meant that $\hat{c}_i = \arg\min_{c \in \{0, 1, 2, 3\}} |\omega^c - \phi_1'|$.

The noise-adaptive decoder first computes the values $\hat{c}_i$, $i \in \{1, 2, 3\}$, as in majority-logic. However, before committing to the hard estimates $\hat{c}_i$, the noise-adaptive decoder checks how close the hard estimates are to their soft counterparts. A global "sensitivity" parameter $\theta$ is established. If $|\arg(\phi_i') - \arg(\omega^{\hat{c}_i})| > \theta$, for some $i \in \{1, 2, 3\}$, all the estimates $\hat{c}_i$ are discarded, and the optimal FHT decoder for the entire block is reverted back to; otherwise, the hard estimates $\hat{c}_i$ are used. Since in practice the channel amplifies the signal by some unknown gain, the difference in phase as a reliability measure is used instead of the difference in magnitude.

To determine the estimate $\hat{c}_0$, once $(\hat{c}_1, \hat{c}_2, \hat{c}_3)$ are committed to, $(\phi_i' = \omega^{\hat{c}_i}$ is set, for all $i \in \{1, 2, 3\}$ and then the equations in (1) are used to compute eight votes for $\phi_0'$. Specifically, $\phi_0' = \frac{1}{8}(r_0 - r_1\phi^*_1 - r_2\phi^*_2 + r_3\phi^*_1\phi^*_2 - r_4\phi^*_3 + r_5\phi^*_1\phi^*_3 + r_6\phi^*_2\phi^*_3 + r_7\phi^*_1\phi^*_2\phi^*_3)$ is set and a hard decision $c_0'$ is made based on $\phi_0'$. Otherwise, if there is no confidence in the estimates $c_i'$, the values are discarded and the optimal FHT decoder for this block is used.

The noise-adaptive decoder can be optimized in many ways. One simple optimization is to compute each $\phi_i'$ separately, and perform the confidence check before computing the next one. In this way, computation is saved if the check fails. Also, each $\phi_i'$ does not need to be set to the average of its four votes, but simply to the sum of the votes, since the only interest is in the phase of $\phi_i'$. Each phase difference is compared $|\arg(\phi_i') - \arg(\omega^{c_i})|$ against $\theta$, which is a non-trivial task, since $\arg()$ is an expensive procedure. To overcome this problem, $\arg()$ is not directly determined. A constant is set $s = \tan \theta$, and the ratio of the real and imaginary parts of $\omega_i'$ is compared with s. This is logically equivalent to comparing $|\arg(\phi_i') - \arg(\omega^{c_i})| \leq \theta$ (with some sign changes depending on the value of $c_i'$), and only requires one multiplication.

Consider an information word $c \in Z_q^k$. The individual symbols $c_i \in Z_q$ can be viewed as coefficients of a first-order polynomial $P(x)=c^T x$, where $x \in \{0, \ldots, p-1\}^k$ for some $p \leq q$. A codeword consists of $n=p^k$ symbols from $Z^q$ and is obtained by evaluating $P(x)$ mod q for all possible values of x. This code is denoted by $\text{FORM}_q(k,p)$. For simplicity, it is assumed in the remainder of this disclosure that p is even. In classic Reed-Muller codes, p=2, as it does for most such codes used in practice.

CCK is essentially isomorphic to the code $\text{FORM}_4(3, 2)$, apart from the negations used for autocorrelation, and the fact that $\phi_0$ is differentially encoded. In fact, as defined $\text{FORM}_4(3, 2)$, $\phi_0$ does not exist at all. Such a "phase shift bit" can be modeled in FORM codes by having an additional information symbol c' act as an additive constant to the polynomial P, so $P(x)=c^T x+c'$.

To derive "votes" for information symbols from a received codeword, a technique is used similar to the one used in Reed's process for decoding binary Reed-Muller codes of arbitrary order. One information symbol is decoded at a time to produce an estimate $c'=(c_1', \ldots, c_k')$ of the original information word c.

For all $1 \in \{1, 2, \ldots, k\}$, let $F_1$ be the set of all pairs (x,y), $x, y \in \{0, \ldots, p-1\}^k$, such that:
- $x_i = y_i$ for all $i \neq 1$,
- $x_1$ is even, and
- $y_1 = x_1 + 1$.

The equality $P(y)-P(x)=c_1$ (mod q) holds for all $(x,y) \in F_1$, and therefore each pair in $F_1$ can be seen as casting a "vote" for $c_1$. The cardinality of $F_1$ is $|F_1|=n/2$, and therefore any number $m \leq n/2$ of independent votes for $c_1$ may be selected from $F_1$.

Using q-PSK modulation, a codeword is sent through the channel as the set $\{\omega^{P(x)}: x \in \{0, \ldots, p-1\}^k\}$, where $\omega=e^{2\pi j/q}$, $j=\sqrt{-1}$. Denote a received symbol by $r_x=\omega^{P(x)}+N_x$, where $N_x$ is a complex Gaussian random variable with mean 0 and variance $2\sigma^2$. A set $V_1 \subseteq F_1$ of m votes for each information symbol is chosen, to compute the following quantity:

$$A_1 \sum_{(x,y) \in V_1} r_y r_x^*$$

Because $P(y)-P(x)=c_1$ (mod q) holds for all $(x,y) \in V_1$, $\omega^{P(y)}(\omega^{P(x)})^* = \omega^{P(y)-P(x)} = \omega^{c_1}$, and therefore $E[r_y r_x^*]=\omega^{c_1}$ and $E[A_1]=m\omega^{c_1}$. The majority-logic decoder now makes a hard decision by setting $c_i'$ to the most likely value in $Z_q$ given the value for $A_1$. For all $i \in Z_q$, let $\phi_i=|\arg(A_1)-\arg(\omega^i)|$. The hard decision is made by setting $c_i'=\arg\min_{i \in Z_q} \phi_i$. This step can be made computationally efficient, especially for some values of q such as q=4.

Not only does $A_1$ provide a value on which to make a hard decision, it also provides us with a measure of how reliable the decision is. If $A_1$ is close to its expectation, there is confidence that the error is small and the decision correct.

The Noise-adaptive decoder accepts the decision when $\phi_{c'} \leq \theta$, for all 1, for some fixed threshold angle $\theta < \pi/q$. Otherwise, it discards the decision and reverts to a ML decoder for the entire block. A small $\theta$ improves the error correcting performance, because the optimal decoder runs more often, but it increases the computational load.

A theoretical lower bound on a symbol error rate $H_e$ of the adapative-noise decoder under the AWGN channel is at most an additive $B_e = e^{-\Omega(m)}$ larger than the symbol error rate $O_e$ of an optimal majority-logic decoder where m is the number of votes chosen to determine for each information symbol, as long as the noise does not exceed a certain threshold. Since m can be made as large as n/2, where n is the block length of the code, this shows that the additive difference $B_e$ in error rate between the noise-adaptive decoder and an optimal majority-logic decoder can be made exponentially small in the block length. For all parameters $\alpha$, $\theta$, and t, such that $0 \leq \alpha \leq 1$, $0 \leq \theta \leq \pi/q$, and $0 \leq t \leq 1$, $H_e \leq O_e + B_e$, where $$B_e \leq e^{-\left(\frac{(1-\alpha)^2 \sin^2(2\pi/q-\theta)}{4\sigma^2}\right)m} + e^{-\left(\frac{t\alpha \sin(2\pi/q-\theta)}{\sigma^2} - \ln\left(\frac{t \arccos(-t)}{(1-t^2)^{3/2}} + \frac{1}{1-t^2}\right)\right)m}.$$

Referring to FIG. 1 as exemplary process used by the noise-adaptive decoder is a process 50. Process 50 receives (51) data such as FORM codes. Process 50 determines (53) the hard estimates. Process 50 determines if the sensitivity parameter is below a threshold. If it is, process 50 continues decoding (61) using, for example, majority-logic decoder or a majority-logic decoding process. If it is not, process 50 discards (57) the hard estimates. Process 50 reverts (59) to a second decoder, for example, a FHT decoder or a second FHT decoding process.

Figure 2:
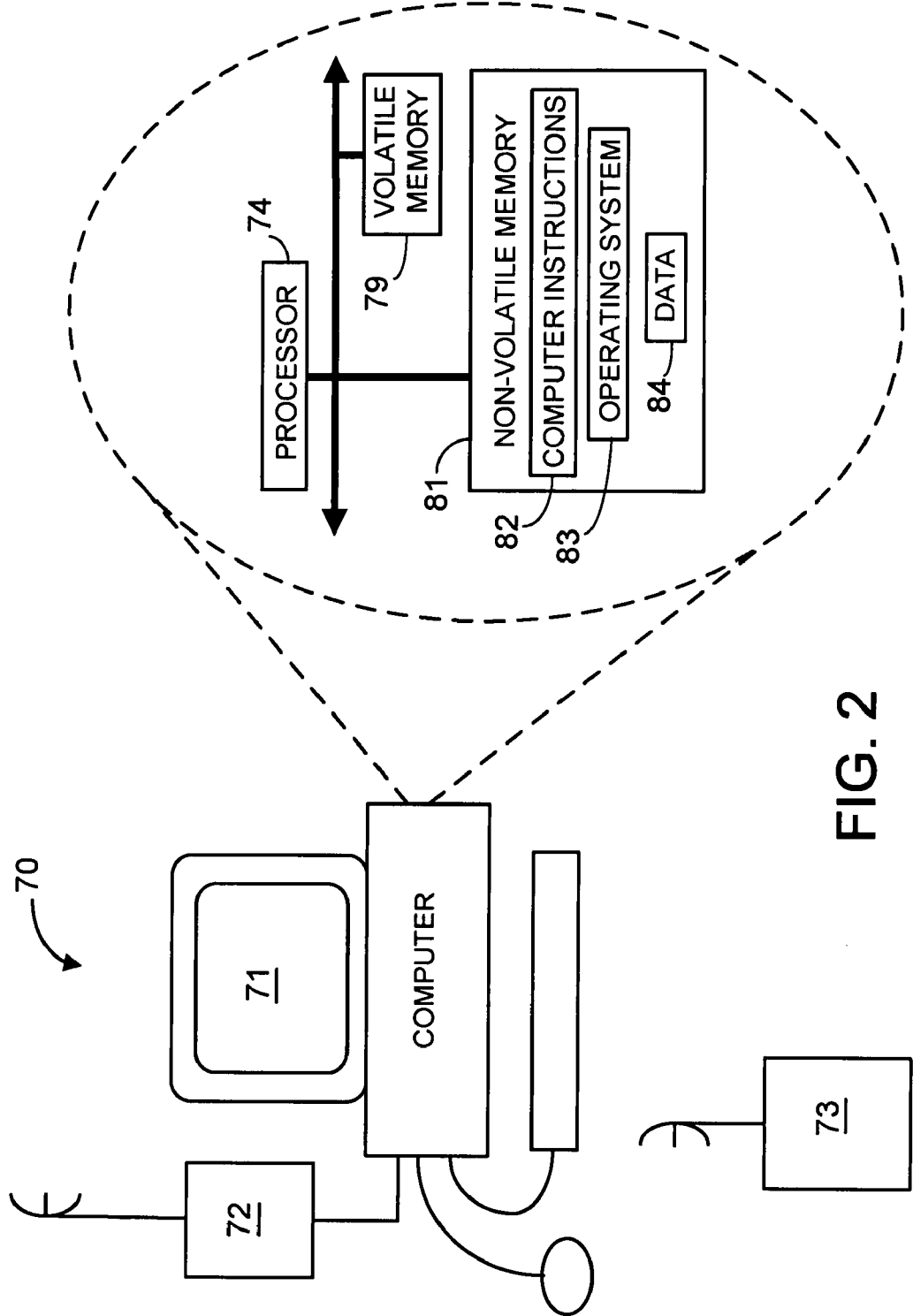
FIG. 2 is a block diagram of a computer system on which the process of FIG. 1 may be implemented.

FIG. 2 shows a decoding system 70 for decoding using process 50 that includes a computer 71, a receiver 72, and a transmitter 73. Computer 71 includes a processor 74 for processing convolutional codes sent from transmitter 73 and received by receiver 72, a volatile memory 79, and a non-volatile memory 81 (e.g., hard disk). Non-volatile memory 81 stores operating system 83, data 84, and computer instructions 82 which are executed by processor 74 out of volatile memory 79 to perform process 50. In one embodiment, computer instructions include executable instruction signals.

Process 50 is not limited to use with the hardware and software of FIG. 2; process 50 may find applicability in any computing or processing environment and with any type of machine that is capable of running a computer program. Process 50 may be implemented in hardware, software, or a combination of the two. Process 50 may be implemented in computer programs executed on programmable computers/machines that each include a processor, a storage medium/article of manufacture readable by the processor (including volatile and non-volatile memory and/or storage elements), at least one input device, and one or more output devices. Program code may be applied to data entered using an input device to perform process 50 and to generate output information.

Each such program may be implemented in a high level procedural or objected-oriented programming language to communicate with a computer system. However, the programs can be implemented in assembly or machine language. The language may be a compiled or an interpreted language. Each computer program may be stored on a storage medium (article) or device (e.g., CD-ROM, hard disk, or magnetic diskette) that is readable by a general or special purpose programmable computer for configuring and operating the computer when the storage medium or device is read by the computer to perform process 50. Process 50 may also be implemented as a machine-readable storage medium, configured with a computer program, where upon execution, instructions in the computer program cause the computer to operate in accordance with process 50.

The estimator uses process 50 for equalization of the information stream. However, the error distance in an equalization process accounts for the known intersymbol interference of the channel.

The invention is not limited to the specific embodiments described herein. For example, the invention is not limited to decoding FORM codes. The invention includes decoding any encoded message format by at least one of two or more processes depending on the noise detected. For example, different decoding processes may used depending on a noise sensitivity parameter. Different ranges of values of noises sensitivity correspond to a decoding process that is implemented.

The invention is not limited to the specific processing order of FIG. 1. Rather, the blocks of FIG. 1 may be re-ordered, as necessary, to achieve the results set forth above.

Other embodiments not described here are also within the scope of the following claims. For example, there has been described novel apparatus and techniques for decoding codes. It is evident that those skilled in the art may now make numerous modifications and uses of and departures from specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A method for decoding, comprising:
   receiving encoded data;
   decoding the encoded data using a first decoding process that is based on majority-logic; and
   decoding the encoded data using a second decoding process if a noise sensitivity parameter is above a threshold value, the noise sensitivity parameter being determined based on the first decoding process.

2. The method of claim 1, wherein the data comprises first-order Reed-Mueller (FORM) codes.

3. The method of claim 1, wherein the data is based on Complementary Code Keying (CCK).

4. The method of claim 1, wherein using the first decoding process comprises:
   determining values of a hard decision based on the first decoding process.

5. The method of claim 4 comprising discarding the values of the hard decision if the noise sensitivity parameter is above the threshold value.

6. The method of claim 3, wherein the second decoding process is based on a Fast Hadamard Transform (FHT).

7. The method of claim 2, wherein the noise sensitivity parameter is based on differences in phase.

8. The method of claim 1, wherein the noise-adaptive decoder uses at least two decoder processes.

9. The method of claim 1, wherein the noise sensitivity parameter is based on detected phase differences.

10. The method of claim 3, wherein the noise sensitivity parameter is based on detected phase differences.

11. Apparatus for decoding, comprising:
    a memory that stores executable instruction signals; and
    a processor that executes the instruction signals to:
      receive encoded data;
      decode the encoded data using a first decoder that is based on majority logic; and
      decode the encoded data using a second decoder if the noise sensitivity parameter is above the threshold value, the noise sensitivity parameter being determined based on the decoding by the first decoder.

12. The apparatus of claim 11, wherein the data comprises first-order Reed-Mueller (FORM) codes.

13. The apparatus of claim 11, wherein the data is based on Complementary Code Keying (CCK).

14. The apparatus of claim 11, wherein the instruction signals to use the first decoder comprises instruction signals to:
    determine values of a hard decision using the first decoder.

15. The apparatus of claim 14 wherein the memory stores instruction signals that cause the process to discard the values of the hard decision if the noise sensitivity parameter is above the threshold value.

16. The apparatus of claim 13, wherein the second decoder is based on a Fast Hadamard Transform (FHT).

17. The apparatus of claim 12, wherein the noise sensitivity parameter is based on differences in phase.

18. The apparatus of claim 11, wherein the noise-adaptive decoder uses at least two decoder processes.

19. The apparatus of claim 11, wherein the noise sensitivity parameter is based on detected phase differences.

20. The apparatus of claim 13, wherein the noise sensitivity parameter is based on detected phase differences.

21. An article comprising a machine-readable medium that stores executable instruction signals for decoding, the instruction signals causing a machine to:
    receive encoded data;
    decode the encoded data using first decoding process that is based on majority logic; and
    decode the encoded data using a second decoding process to if the noise sensitivity parameter is above the threshold value, the noise sensitivity parameter being determined based on the first decoding process.

22. The article of claim 21, wherein the data comprises first-order Reed-Mueller (FORM) codes.

23. The article of claim 21, wherein the data is based on Complementary Code Keying (CCK).

24. The article of claim 21, wherein the instruction signals causing a machine to use the noise-adaptive decoder comprise instruction signals causing a machine to:
    determine values of a hard decision based on the first decoding process.

25. The article of claim 24, wherein the instruction signals comprise instruction signals that cause the machine to discard the values of the first decision if the noise sensitivity parameter is above the threshold value.

26. The article of claim 23, wherein the second decoder process is based on a Fast Hadamard Transform (FHT).

27. The article of claim 22, wherein the noise sensitivity parameter is based on differences in phase.

28. The article of claim 21, wherein the noise-adaptive decoder uses at least two decoder processes.

29. The article of claim 21, wherein the noise sensitivity parameter is based on detected phase differences.

30. The article of claim 23, wherein the noise sensitivity parameter is based on detected phase differences.

31. A receiver, comprising:
    a noise-adaptive decoder to
      receive encoded data;
      decode the encoded data using a first decoding process;
      discard values output by the first decoding process if a noise sensitivity parameter is above a threshold value, the noise sensitivity parameter being determined based on differences in phase; and
      decode the encoded data using a second decoding process if the noise sensitivity parameter is above the threshold value.

32. The receiver of claim 31, wherein the receiver is in a software radio system.

33. The receiver of claim 31, wherein the receiver is in a wireless local area network.

34. The receiver of claim 31, further comprising a transceiver, wherein the transceiver comprises the receiver.

35. The receiver of claim 31, further comprising an integrated circuit; wherein the integrated circuit comprises the noise-adaptive decoder.

36. The receiver of claim 31, wherein the data comprises first-order Reed-Mueller (FORM) codes.

37. The receiver of claim 31, wherein the data is based on Complementary Code Keying (CCK).

* * * * *